(12) United States Patent
Snell et al.

(10) Patent No.: US 10,726,321 B2
(45) Date of Patent: Jul. 28, 2020

(54) METHOD OF MANUFACTURING A SMARTCARD

(71) Applicant: Zwipe AS, Oslo (NO)

(72) Inventors: Devin Snell, Colorado Springs, CO (US); Jose Ignacio Wintergerst Lavin, Colorado Springs, CO (US)

(73) Assignee: Zwipe AS, Oslo (NO)

( * ) Notice: Subject to any disclaimer, the term of this patent is extended or adjusted under 35 U.S.C. 154(b) by 89 days.

(21) Appl. No.: 16/084,730

(22) PCT Filed: Sep. 12, 2016

(86) PCT No.: PCT/EP2016/071438
§ 371 (c)(1),
(2) Date: Sep. 13, 2018

(87) PCT Pub. No.: WO2017/162313
PCT Pub. Date: Sep. 28, 2017

(65) Prior Publication Data
US 2019/0102662 A1 Apr. 4, 2019

Related U.S. Application Data

(60) Provisional application No. 62/312,773, filed on Mar. 24, 2016.

(30) Foreign Application Priority Data

Apr. 22, 2016 (GB) .................................. 1607029.4

(51) Int. Cl.
*G06K 19/077* (2006.01)
*G06K 19/07* (2006.01)
(Continued)

(52) U.S. Cl.
CPC ...... *G06K 19/0773* (2013.01); *B32B 37/1284* (2013.01); *G06K 19/0718* (2013.01);
(Continued)

(58) Field of Classification Search
CPC ........... G06K 19/0773; G06K 19/0718; G06K 19/07722; G06K 19/07747; G06K 19/07749; G06K 19/07769
(Continued)

(56) References Cited

U.S. PATENT DOCUMENTS

| 5,255,430 | A | 10/1993 | Tallaksen | |
| 6,404,643 | B1* | 6/2002 | Chung | B32B 3/08 361/737 |

(Continued)

FOREIGN PATENT DOCUMENTS

| EP | 2034429 A1 | 3/2009 |
| EP | 2869243 A1 | 5/2015 |

(Continued)

OTHER PUBLICATIONS

International Search Report and Written Opinion, PCT/EP2016/071438, dated Apr. 10, 2017 (16 pp.).
GB1607029.4 Search Report, dated May 27, 2016 (3 pp.).

*Primary Examiner* — Paultep Savusdiphol
(74) *Attorney, Agent, or Firm* — Eversheds Sutherland (US) LLP

(57) ABSTRACT

A method of manufacturing a smartcard may include providing a flexible smartcard circuit, forming conductive extension members on and extend away from the flexible circuit from a high melting point solder material, and laminating the flexible circuit to form a smartcard body. A cavity is then milled in the smartcard body to expose the ends of the extension members, and a contact pad is inserted into the cavity and electrically connected to extension mem- (Continued)

bers using a low melting temperature tin-bismuth solder using ultrasonically soldering, so as to avoid heat damage to the card body.

24 Claims, 2 Drawing Sheets

(51) Int. Cl.
*B32B 37/12* (2006.01)
*H05K 1/18* (2006.01)

(52) U.S. Cl.
CPC . *G06K 19/07722* (2013.01); *G06K 19/07747* (2013.01); *G06K 19/07749* (2013.01); *G06K 19/07754* (2013.01); *G06K 19/07769* (2013.01); *H05K 1/182* (2013.01)

(58) Field of Classification Search
USPC .................................................. 235/487, 492
See application file for complete search history.

(56) References Cited

U.S. PATENT DOCUMENTS

| 2009/0151150 A1* | 6/2009 | Ayala ............... G06K 19/07745 |
| | | 29/600 |
| 2010/0230496 A1* | 9/2010 | Kim ..................... G06K 19/07 |
| | | 235/488 |
| 2011/0011939 A1* | 1/2011 | Seah ............... G06K 19/07749 |
| | | 235/492 |

FOREIGN PATENT DOCUMENTS

| JP | H11328349 A | 11/1999 |
| WO | 2008035883 A1 | 3/2008 |
| WO | 2009078810 A1 | 6/2009 |
| WO | 2013160011 A1 | 10/2013 |

* cited by examiner

METHOD OF MANUFACTURING A SMARTCARD

TECHNICAL FIELD

The present invention relates to a smartcard and to its method of manufacture, and more particularly to the manner in which a component to be exposed from the smartcard is mounted to an embedded circuit board of the smartcard during manufacture.

BACKGROUND OF THE INVENTION

The term smartcard refers generally to any pocket-sized card that has one or more integrated circuits embedded therein. Examples of common smartcard applications include payment cards, access cards, and the like.

The contact pad is the designated surface area of the smartcard that permits electrical contact to be made with an external device. Where the smartcard contains sensitive data, such as in the case of payment cards and the like, a secure element is used to store the data. A secure element is a tamper-proof chip that provides a secure memory and execution environment in which application code and application data can be securely stored and administered. The secure element ensures that access to the data stored on the card is provided only when authorised. In conventional smartcards, the secure element is mounted to the back of the contact pad such that the contact pad and secure element form a single unit. The combined unit, including both a contact pad and a secure element, is often referred to as a contact module.

Recent developments in smartcards technology have allowed for the incorporation of biometric sensors, such as fingerprint sensors, into smartcards to provide improved security. The biometric sensor reads detected biometric data and supplies this to a microcontroller for user verification, and once verified the microcontroller instructs or allows the secure element to communicate with a payment terminal or the like through the contact pad. This requires the biometric module to communicate directly with the secure element. However, the secure element in a conventional contact module is fully enclosed and there is no easy way of interacting.

Thus, where the smartcard includes additional security measures, such as the biometric authentication described above, it has been found to be advantageous to configure the contact pad and secure element separately within the smartcard, i.e. such that each component occupies its own "real estate" on the circuit board of the smartcard. This arrangement permits simpler control of the secure element by a biometric authentication module. For example, in low security applications, a simple switch controlled by the biometric authentication module can be provided between the secure element and the contact pad to permit or disable communication. However, this configuration also gives rise to manufacturing difficulties.

SUMMARY OF THE INVENTION

The present invention provides a smartcard comprising: a card body enclosing a flexible circuit, wherein conductive extension members extend away from the flexible circuit, and wherein a material forming the extension members has a melting temperature higher than the melting temperature of a material forming the card body; a cavity formed in the card body and exposing the extension members; and a contact pad received in the cavity and connected to the extension members by an electrical connection, wherein the electrical connection was formed at a temperature below the melting temperature of the material forming the card body.

In this smartcard, the contact pad is raised off of the flexible circuit in order for it to be exposed at the correct height from the card body, whilst still being electrically connecting the contact pad to the circuit, by the extension members. This configuration allows a secure element to be located elsewhere than directly behind the contact pad.

In order to ensure sufficient longevity of the card, it is necessary to be aware of the temperature sensitivity of the materials used typically for smartcards, which do not allow for traditional soldering. For example, most typical solders must be heated to temperatures of over about 240° C. to become molten, whereas polyvinyl chloride (PVC), which is the most common material used to produce laminated cards, has a melting temperature of only 160° C. (and a glass transition temperature of only 80° C.). Polyurethane (PU), which is also commonly used as filler for laminated cards, would also be damaged by exposure to temperatures in the region of 240° C.

To avoid overheating the card body materials, the above smartcard uses a high melting point material to form extension members on the flexible circuit, which will survive a lamination process or the like, and then a low temperature connection to conductively join the contact pad to the extension members. The use of a low temperature electrical connection avoids any physical deformation of the card material.

Whilst the above embodiment relates to a secure element, it will be appreciated that the same configuration may also be employed for other elements that are required to be connected to the flexible circuit and exposed from the body of the smartcard.

Various forms of electrical connection may be used. For example, the electrical connection may be any one of a mechanical connection, a conductive adhesive connection, and a metallic solder connection. As discussed above, a formation temperature (e.g. a curing temperature, or a melting temperature, or a reflow temperature) of the electrical connection is lower than a melting temperature of the material of the card body. Thus, forming the electrical connection will not cause deformation of the card. In one embodiment, the electrical connection may have a formation temperature below 150° C., and preferably below 140° C.

Where the electrical connection comprises a conductive adhesive, the conductive adhesive preferably has a curing temperature below the melting temperature of the material forming the card body. Exemplary conductive adhesives include conductive epoxies, and in one preferred embodiment the connection comprises an anisotropic conductive film (ACF). However, other adhesives such as conductive resins may also be used to provide the electrical connections.

A mechanical connection does not typically require heating. This has the advantage of not requiring thermal or physico-chemical processes, and enables room temperature manufacturing with no preparation or wait times. One exemplary mechanical connection is an elastomeric connector (sometimes known as a Zebra Connector®). The elastomeric connector comprise mated male and female terminals, each having alternating conductive and non-conductive stages that engage the respective stages of the corresponding terminal. In another example, the mechanical connection may comprise embedded conductive stubs that are configured to deform so as to conform to uneven surfaces. The stubs may be made of carbon or silver or copper.

Where the electrical connection comprises a solder connection, a solder material forming the solder connection preferably has a reflow temperature below the melting temperature of the material forming the card body, and in various embodiments a melting temperature of the solder material may also be below the melting of the material forming the card body.

If a solder material is used, the solder material may be a tin-bismuth solder. Such solders have typical melting temperatures of approximately 139° C. This is below the typical lamination temperatures discussed above, and is particularly below the 160° C. melting temperature of PVC.

Preferably the melting temperature of the material forming the extension members is at least 10° C. above the melting temperature of the material forming the card body. This permits a clear range in which the card body can be thermally laminated, i.e. by melting and combining layers of material to form the card body around the circuit, without damaging the extension members. Preferably, the material forming the extension members has a melting temperature above 200° C., and preferably above 210° C.

The extension members may be formed from any suitable material, but are preferably formed from a metallic material. The use of a metallic material allows for the card to employ a metal-to-metal connection between the contact pad and the flexible circuit, which provides high durability to provide maximum life to the smartcard—a typical payment card, for example, must have a minimum lifetime of three years.

In one embodiment the material forming the conductive extension members is a solder material. This solder material may comprise any suitable conductive solder, and preferably a RoHS-compliant, lead-free solder is used, such as a tin-based solder or a copper-based solder. In a preferred embodiment, the solder material is Sn—Ag—Cu solder, which has ternary eutectic behaviour (217° C.), which is below the Sn-3.5Ag (wt. %) eutectic of 221° C. and the Sn-0.7Cu eutectic of 227° C.

In various configurations, the extension members may have a height of at least 200 μm, and preferably at least 300 μm. The extension members preferably have a height of less than 762 μm, i.e. the thickness of a ISO 7816 smartcard, and preferably less than 500 μm.

One or more components in addition to the contact pad may also be connected to the flexible circuit. These components may be embedded within the card body (e.g. attached before a lamination process) or may be exposed from the card body.

For example, a secure element may be connected to the flexible circuit. The secure element is preferably embedded within the card body. The flexible circuit may be arranged to permit communication between a secure element and the contact pad via the extension members. The circuit is preferably arranged such that the secure element does not to overlap with a contact pad connected to the extension members (i.e. viewed in a direction perpendicular to the face of the smartcard).

In another example, either with or without a secure element, a biometric authentication module may be connected to the flexible circuit. The biometric authentication module may be configured to detect a biometric characteristic of a bearer of the card and authenticate their identity based on stored biometric data. The biometric authentication module may be configured to command the secure element of the smartcard (if present) to transmit data responsive to authentication of the bearer of the card. In one particular embodiment, the biometric is a fingerprint.

The biometric authentication module may be attached before or after the lamination, or a combination of the two. For example, the biometric authentication module may include a processing unit and a biometric sensor. The processing unit of the biometric authentication module may be embedded within the card body (i.e. it was connected to the circuit before a lamination process or the like) and the sensor of the biometric authentication module may be exposed from the card body. This arrangement prevents damage to the sensitive components within the sensor due to the high pressure and temperatures experienced during lamination or other manufacturing techniques.

The circuit is preferably arranged to permit communication between the biometric authentication module (and particularly the processing unit thereof) and the secure element and/or the contact pad. In another embodiment, the circuit may include a switch to permit or prevent communication between the secure element and an external device (e.g. the switch may be located between the secure element and the contact pad). The circuit is then preferably arranged to permit the biometric authentication module (and particularly the processing unit thereof) to control the switch.

In addition to the contact pad, the smartcard may further comprise an antenna. The antenna is preferably configured to communicate with the secure element. Thus, the smartcard may permit both contact transactions and contactless transactions.

The smartcard may include a near field communication (NFC) transponder connected to the antenna, e.g. for additional/secondary communication with the same or a different reader. The smartcard transponder may include energy harvesting circuitry which is configured to rectify a received RF signal and store energy using an energy storage component within the smartcard.

Preferably the cavity does not expose the flexible circuit. Thus, the flexible circuit remains fully enclosed, and also the material of the card body between the circuit and the contact pad will provide further support for the contact pad.

The card body may be formed from a plastics material, and preferably PVC and/or PU. For example, the card body may comprise a PVC layer on either side of the flexible circuit with an intermediate layer between the PVC layers. The intermediate layer may comprise a plastics material such as PVC or PU. In various embodiments, the flexible circuit is a flexible printed circuit board, which is preferably printed on a plastics material. The plastics material preferably has a temperature above the lamination temperature and/or will not be damaged by the lamination. Exemplary plastics materials include polyimide, polyester and polyether ether ketone (PEEK).

The smartcard may be any one of an access card, a credit card, a debit card, a pre-pay card, a loyalty card, an identity card, a cryptographic card, or the like.

Viewed from a second aspect, the present invention provides a method of manufacturing a smartcard comprising: providing a card body enclosing a flexible circuit, wherein conductive extension members extend away from the flexible circuit, wherein a material forming the extension members has a melting temperature higher than the melting temperature of a material forming the card body, and wherein a cavity is formed in the card body exposing the extension members; inserting a contact pad into the cavity; and electrically connecting the contact pad to the extension members using at a temperature below the melting temperature of the material forming the card body.

In various embodiments, the smartcard is a smartcard as described in the first aspect, and any one or more or all of the preferred features thereof may apply also to this method.

As discussed above, various forms of electrical connection may be used. For example, the electrical connection may be any one of a mechanical connection, a conductive adhesive connection, and a metallic solder connection. In one embodiment, the step of electrically connecting the contact pad to the extension members may take place at a temperature below 150° C., and preferably below 140° C.

Where the electrical connection uses a conductive adhesive, the method may comprise applying a conductive adhesive to the contact pad and/or to the extension members. This step preferably takes place before inserting the contact pad into the cavity. The method preferably further comprises curing the conductive adhesive at a temperature below the melting temperature of the material forming the card body. The conductive adhesive may comprise a conductive epoxy, and in one example the electrical connection comprises an anisotropic conductive film (ACF).

Where the electrical connection uses a mechanical connection, the extension members and/or the contact pad are preferably provided with the mechanical connections. The step of electrically connecting thus preferably comprises mechanically electrically connecting the contact pad to the extension members. The step preferably takes place at approximately ambient temperature.

Where the electrical connection comprises a solder connection, the electrically connecting preferably comprises heating a solder material to cause it to reflow and form the electrical connection between the extension members and the contact pad. The heating is preferably to a temperature below the melting temperature of the material forming the card body. The electrically connecting the contact pad to the extension members may use ultrasonic soldering, i.e. wherein ultrasound energy is used to melt the solder material. Using an ultrasonic heating process will cause the solder to reflow at lower temperatures than if heat alone were to be applied.

Providing the card body may comprise removing material from the card body to create the cavity and expose the extension members. Preferably, the step of removing material comprises removing sufficient that the contact pad does not project beyond the surface of the card body when received therein.

The step of removing material may include removing material from the extension members to create a flat, contact surface for connection with the contact pad. This is particularly useful where a soldered or adhesive connection is to be made between the extension members and the contact pad, to ensure a good electrical connection.

The step of removing material preferably does not expose the flexible circuit. Thus, the remaining material of the card body will provide further support for the contact pad.

The removal of material may be performed by any suitable process, such as milling.

The step of removing material may be performed after the card has been laminated or before lamination, e.g. in case the components are already in place. In alternative embodiments, the card body may be formed in a manner such that removal of material is not required to form the cavity. For example, the cavity may be cut before lamination of the card, or may be moulded during a lamination process. For example, the laminate sheets may die-cut before lamination to avoid a lengthier milling process.

Providing the card body may comprise forming the card body. In one embodiment, the card body is formed by a thermal lamination process. The thermal lamination process may take place at temperatures above about 150° C. Typical lamination temperatures are often below 200° C. For example, in one embodiment, the lamination may take place at a temperature between 160° C. and 190° C.

The melting temperature of the material forming the extension members is preferably higher than the temperature of the thermal lamination. In some embodiments, the lamination may include two or more stages at different temperatures. In such a circumstance, reference to the "the temperature of the thermal lamination" should be understood to refer to the peak temperature that is sustained during the lamination process. Thus, the extension members will not be deformed by the heating applied during the lamination process.

The card body may be formed from a plastics material suitable for thermal lamination. For example, the card body may comprise one or more layers of PVC and/or PU. In one embodiment, the card body comprises an outer layer (e.g. a PVC layer) on either side of the flexible circuit with an intermediate layer between the outer layers. The intermediate layer may comprise a plastics material such as PVC or PU, or other materials such as silicone. The intermediate layer may comprise a liquid or semi-solid/pelletized material.

Whilst the flexible circuit may be provided already including the extension members, in some embodiments these must be added. Thus, the method may comprise forming the extension members by melting a conductive metallic material and depositing the molten conductive metallic material onto the flexible circuit.

In some embodiments, a secure element may be connected to the flexible circuit. In this case, the secure element is preferably connected before a lamination process, i.e. such that it is enclosed within the card body.

In some embodiment, a biometric authentication module may be connected to the flexible circuit. The biometric authentication module may be attached before or after the lamination process, or a combination of the two. For example, the biometric authentication module may include a processing unit and a biometric sensor. The processing unit of the biometric authentication module may be connected to the circuit before the lamination and the sensor may be installed after lamination.

BRIEF DESCRIPTION OF THE DRAWINGS

Certain preferred embodiments of the present invention will now be described in greater detail, by way of example only and with reference to the accompanying drawings, in which.

It should be noted that for clarity the thicknesses of the various parts shown in FIGS. 1 to 5 has been exaggerated significantly. In implementations of smartcards of the type illustrated in the Figures, the width of the card might be 7 cm whereas the thickness of the card would be less than 1 mm. A total thickness between the outer surfaces of 762 μm is typical.

DETAILED DESCRIPTION OF THE INVENTION

Figure 1:
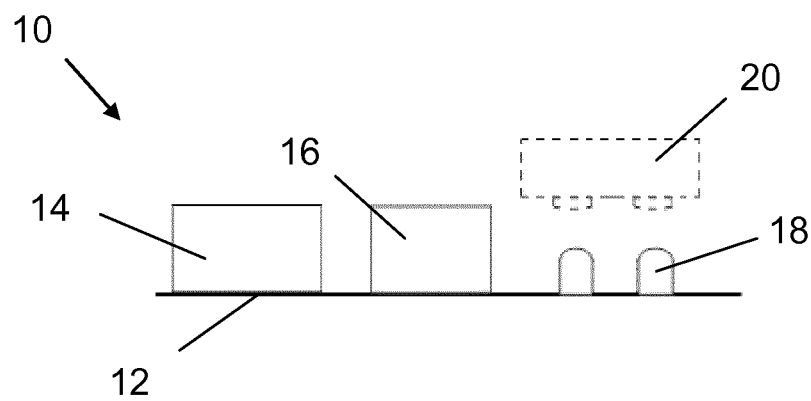
FIGS. 1 to 5 illustrate the steps of a method of mounting a contact pad to a flexible printed circuit board assembly of a smartcard.

FIG. 1 illustrates a flexible printed circuit board assembly (FPCBA) 10 for a smartcard. The circuit board assembly 10 comprises a flexible printed circuit board 12 on which are mounted various components to be embedded within the smartcard. These components should each be capable of withstanding the temperatures and pressures arising during a thermal lamination process, such as that described later.

Illustrated in FIG. 1 are a secure element 14 and a fingerprint processing unit 16, which are both connected to the flexible circuit board 12. However, in various embodiments, one or other of these may not be present, and/or further components may also be present.

Figure 6:
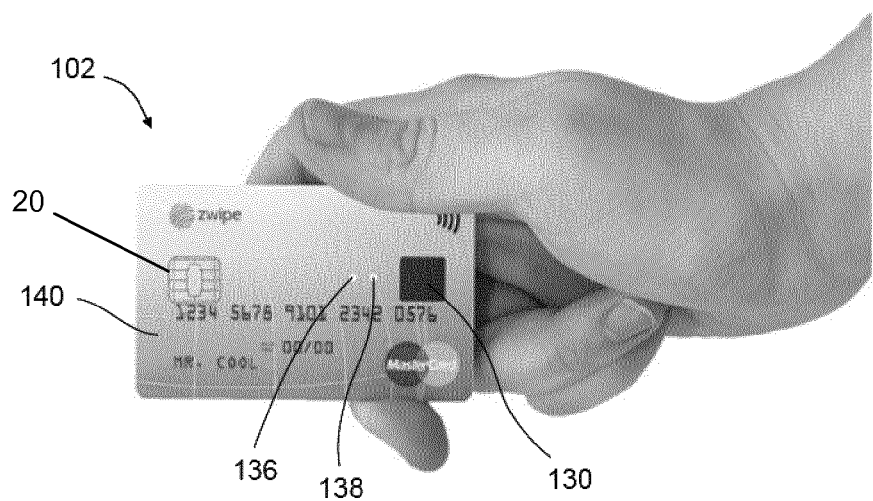
FIG. 6 illustrates a smartcard manufactured by this method.

The fingerprint processing unit 16 will form part of a fingerprint authentication module, when connected to a fingerprint sensor 130, such as the area fingerprint reader 130 shown in FIG. 6. The processing unit 16 comprises a microprocessor that is chosen to be of very low power and very high speed, so as to be able to perform biometric matching in a reasonable time.

The fingerprint authentication engine is arranged to scan a finger or thumb presented to the fingerprint reader 130 and to compare the scanned fingerprint of the finger or thumb to pre-stored fingerprint data using the processing unit 16. A determination is then made as to whether the scanned fingerprint matches the pre-stored fingerprint data.

If a match is determined, then the fingerprint authentication engine will authorise the secure element 14 to transmit data from the card via a contact pad 20 (shown in phantom on FIG. 1). On the FPCBA 10 are formed a plurality of electrically-conductive extension members 18 to which the contact pad will be connected. The extension members 18 extend away from the flexible circuit board 12 in a direction that is generally perpendicular to the face of the smartcard. The extension members 18 are formed for connection to a contact pad 20 so as to permit the contact pad 20 to communicate with the circuit board 12.

The extension members 18 are formed from a metallic solder material that can withstand a lamination process. Exemplary solder materials include tin-based or a copper-based solders having a melting temperature over about 200° C. (so as to withstand lamination), but below 300° C. (so as to still be easily soldered). The extension members 18 are formed as solder blobs on suitable contacts of the flexible circuit board 12 so as to extend in a direction substantially perpendicular to the surface of the circuit board 12. The extension members have a height of about 300 μm to 400 μm and do not need to be completely uniform as they will be milled to a flat surface after lamination.

Figure 2:
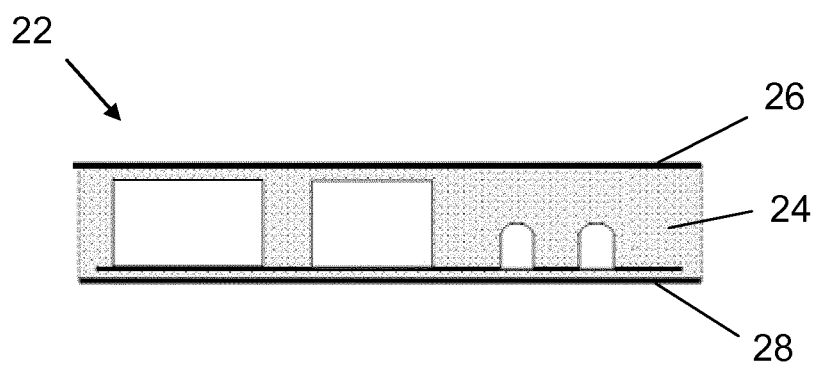

To form the main body 22 of the smartcard, the FPCBA 10 is encased in polyurethane (PU) filler 24 and a sandwiched between two polyvinyl chloride (PVC) sheets 26, 28. The two PVC sheets 26, 28 each have a thickness of approximately 80 μm and the intermediate layer formed by the FPCBA 10 and the PU filler 24 has a thickness of approximately 540 μm. The pre-laminated card body is then compressed and heated to a temperature between 160° C. and 190° C. to form a single, laminated card body 22. The laminated card body 22 is illustrated in FIG. 2.

Figure 3:
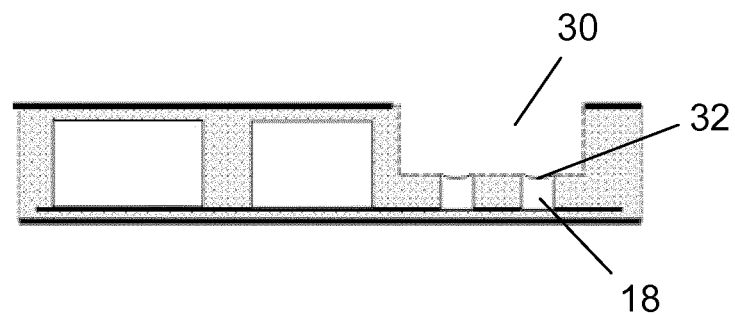

Next, a cavity 30 is milled into the laminated card body 22. The cavity 30 is milled to a depth sufficient to receive the contact pad 20 such that the surface of the contact pad 20 will be flush with the surface of the card body 22. The milling also cuts into the extension members 18 such that the solder bumps are flattened to form a uniform, flat surfaces 32 to which the contact pad 20 can be attached. The cavity 30 is illustrated in FIG. 3.

Figure 4:
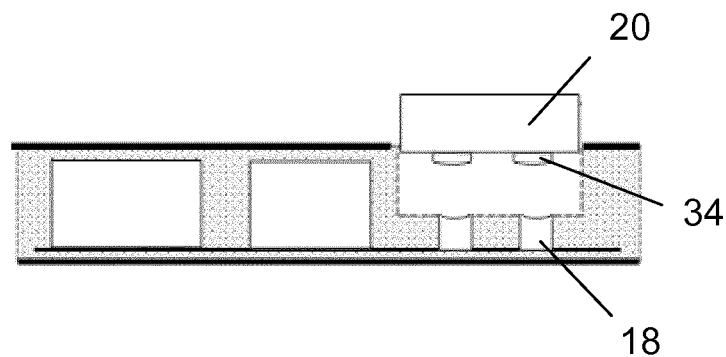

In order to install the contact pad 20 into the smartcard, a tin-bismuth solder is used to form solder blobs 34 on the rear contacts of the contact pad 20. The contact pad 20 is then inserted into the cavity 30 such that the contacts of the contact pad align with the surfaces 32 of the extension members 18, as illustrated in FIG. 4.

In order to form a permanent connection between the contact pad 20 and the extension members 18, ultrasonic energy is used to heat the tin-bismuth solder blobs 34 above their melting temperatures (approx. 139° C.). Using tin-bismuth solder allows the components to be reflowed at a lower temperature which does not damage the materials of the card body 22. Tin-bismuth solder is sufficiently conducive to provide the connection needed for the contact pad 20 to communicate with the secure element 16 and the other components 14 of the FPCBA 10.

Figure 5:
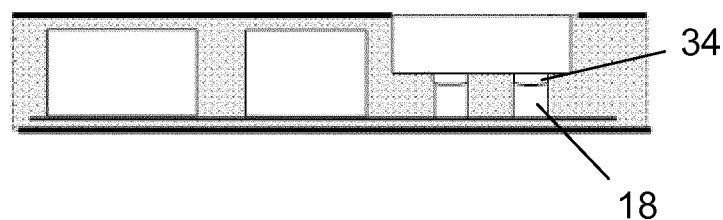

FIGS. 5 and 6 illustrate the assembled card 102 where the contact pad 20 is permanently connected to the flexible circuit board 12 via the tin-bismuth solder 34 and the extension members 18.

It should be apparent that the foregoing relates only to the preferred embodiments of the present application and the resultant patent. Numerous changes and modification may be made herein by one of ordinary skill in the art without departing from the general spirit and scope of the invention as defined by the following claims and the equivalents thereof.

The invention claimed is:

1. A smartcard comprising:
   a card body enclosing a flexible circuit, wherein conductive extension members extend away from the flexible circuit, and wherein a material forming the extension members has a melting temperature higher than the melting temperature of a material forming the card body;
   a cavity formed in the card body and exposing the extension members; and
   a contact pad received in the cavity and connected to the extension members by an electrical connection, wherein the electrical connection was formed at a temperature below the melting temperature of the material forming the card body;
   wherein the extension members have a height of at least 200 μm.

2. A smartcard according to claim 1, wherein the electrical connection has a formation temperature below 150° C., and preferably below 140° C.

3. A smartcard according to claim 1, wherein the electrical connection comprises a solder connection, a solder material forming the solder connection having a reflow temperature below the melting of the material forming the card body.

4. A smartcard according to claim 3, wherein the solder material is a tin-bismuth solder.

5. A smartcard according to claim 1, wherein the electrical connection comprises a conductive adhesive having a curing temperature below the melting temperature of the material forming the card body.

6. A smartcard according to claim 5, wherein the electrical connection comprises an anisotropic conductive film.

7. A smartcard according to claim 1, wherein the electrical connection comprises a mechanical connection.

8. A smartcard according to claim 1, wherein the extension members are formed from a metallic material.

9. A smartcard according to claim 8, wherein the metallic material is a solder material.

10. A smartcard according to claim 1, wherein the extension members have a height of at least 300 μm.

11. A smartcard according to claim 1, further comprising a secure element connected to the flexible circuit, wherein the circuit is arranged such that the secure element does not to overlap with the contact pad.

12. A smartcard according to claim 11, wherein the smartcard further comprises a biometric authentication module, the biometric authentication module being configured to authenticate the identity of a bearer of the smartcard, and to command the secure element of the smartcard to transmit data responsive to authentication of the bearer of the card.

13. A smartcard according to claim 11, wherein the smartcard comprises an antenna configured to communicate with the secure element.

14. A smartcard according to claim 1, wherein the card body is formed from a plastics material, and preferably comprises polyvinyl chloride (PVC) and/or polyurethane (PU).

15. A method of manufacturing a smartcard comprising:
providing a card body enclosing a flexible circuit, wherein conductive extension members extend away from the flexible circuit, wherein a material forming the extension members has a melting temperature higher than the melting temperature of a material forming the card body, wherein a cavity is formed in the card body exposing the extension members, and wherein the extension members have a height of at least 200 μm;
inserting a contact pad into the cavity; and
electrically connecting the contact pad to the extension members using at a temperature below the melting temperature of the material forming the card body.

16. A method according to claim 15, wherein the step of electrically connecting the contact pad to the extension members takes place at a temperature below 150° C., and preferably below 140° C.

17. A method according to claim 15, wherein the electrical connection comprises a metallic solder connection.

18. A method according to claim 17, wherein the metallic solder connection is formed from a tin-bismuth solder.

19. A method according to claim 17, wherein the step of electrically connecting the contact pad to the extension members uses ultrasonic soldering.

20. A method according to claim 15, wherein the electrical connection comprises a mechanical connection or a conductive adhesive connection.

21. A method according to claim 15, wherein the step of providing the card body comprises removing material from the card body to create the cavity and expose the extension members.

22. A method according to claim 21, wherein the step of removing material includes removing material from the extension members to create a flat, contact surface for connection with the contact pad.

23. A method according to claim 15, wherein the step of providing the card body comprises forming the card body by a thermal lamination process.

24. A method according to claim 23, wherein the melting temperature of the material forming the extension members is higher than the temperature of the thermal lamination.

* * * * *